US012643127B2

(12) United States Patent　　(10) Patent No.:　US 12,643,127 B2

Jiang　　(45) Date of Patent:　Jun. 2, 2026

(54) WAVEFORM IMPROVEMENT METHOD AND ULTRASONIC TRANSDUCER CAPABLE OF OPTIMIZING ACOUSTIC IMPEDANCE

(71) Applicant: QISDA CORPORATION, Taoyuan City (TW)

(72) Inventor: Fu-Sheng Jiang, Taoyuan City (TW)

(73) Assignee: QISDA CORPORATION, Taoyuan City (TW)

( * ) Notice: Subject to any disclaimer, the term of this patent is extended or adjusted under 35 U.S.C. 154(b) by 853 days.

(21) Appl. No.: 17/994,408

(22) Filed: Nov. 28, 2022

(65) Prior Publication Data

US 2023/0226572 A1　Jul. 20, 2023

(30) Foreign Application Priority Data

Jan. 14, 2022　(TW) ................................. 111101620

(51) Int. Cl.
| | |
|---|---|
| *B06B 1/00* | (2006.01) |
| *B06B 1/06* | (2006.01) |
| *G10K 11/02* | (2006.01) |
| *H10N 30/05* | (2023.01) |
| *H10N 30/20* | (2023.01) |
| *H10N 30/50* | (2023.01) |

(52) U.S. Cl.
CPC .............. *B06B 1/067* (2013.01); *G10K 11/02* (2013.01); *H10N 30/05* (2023.02); *H10N 30/20* (2023.02); *H10N 30/50* (2023.02)

(58) Field of Classification Search
CPC ... B06B 1/067; B06B 2201/76; B06B 1/0622;
G10K 11/02; H10N 30/05; H10N 30/20;
H10N 30/50; H10N 30/088; A61B
8/4281; A61B 8/4494
See application file for complete search history.

(56) References Cited

U.S. PATENT DOCUMENTS

| | | | |
|---|---|---|---|
| 2002/0156373 A1* | 10/2002 | Wakabayashi | ........ B06B 1/0622 |
| | | | 600/437 |
| 2009/0062655 A1 | 3/2009 | Saito | |
| 2009/0069691 A1* | 3/2009 | Saito | ...................... G10K 11/02 |
| | | | 600/459 |

(Continued)

FOREIGN PATENT DOCUMENTS

| | | |
|---|---|---|
| CN | 101431941 | 5/2009 |
| CN | 104586430 | 5/2015 |

(Continued)

*Primary Examiner* — Julio C. Gonzalez
(74) *Attorney, Agent, or Firm* — Winston Hsu

(57) ABSTRACT

A waveform improvement method includes providing a piezoelectric material coupled to a matching material, generating a plurality of first grooves in a matching layer of at least one matching layer, packaging an isolation material into the plurality of first grooves, and providing two input voltages to the piezoelectric material for generating an ultrasonic signal by the piezoelectric material. The piezoelectric material includes at least one piezoelectric layer. The matching material includes at least one matching layer. The matching material is used to match acoustic impedance of the piezoelectric material. The plurality of first grooves in the matching layer are used to optimize the acoustic impedance and a vibration isolation effect.

16 Claims, 5 Drawing Sheets

(56)                    References Cited

U.S. PATENT DOCUMENTS

2014/0070668 A1*   3/2014  Ona ..................... B06B 1/0629
                                                29/25.35
2016/0199031 A1*   7/2016  Lee ..................... A61B 8/4444
                                                600/459

FOREIGN PATENT DOCUMENTS

CN          105769239        7/2016
JP          2002-247696      8/2002

* cited by examiner

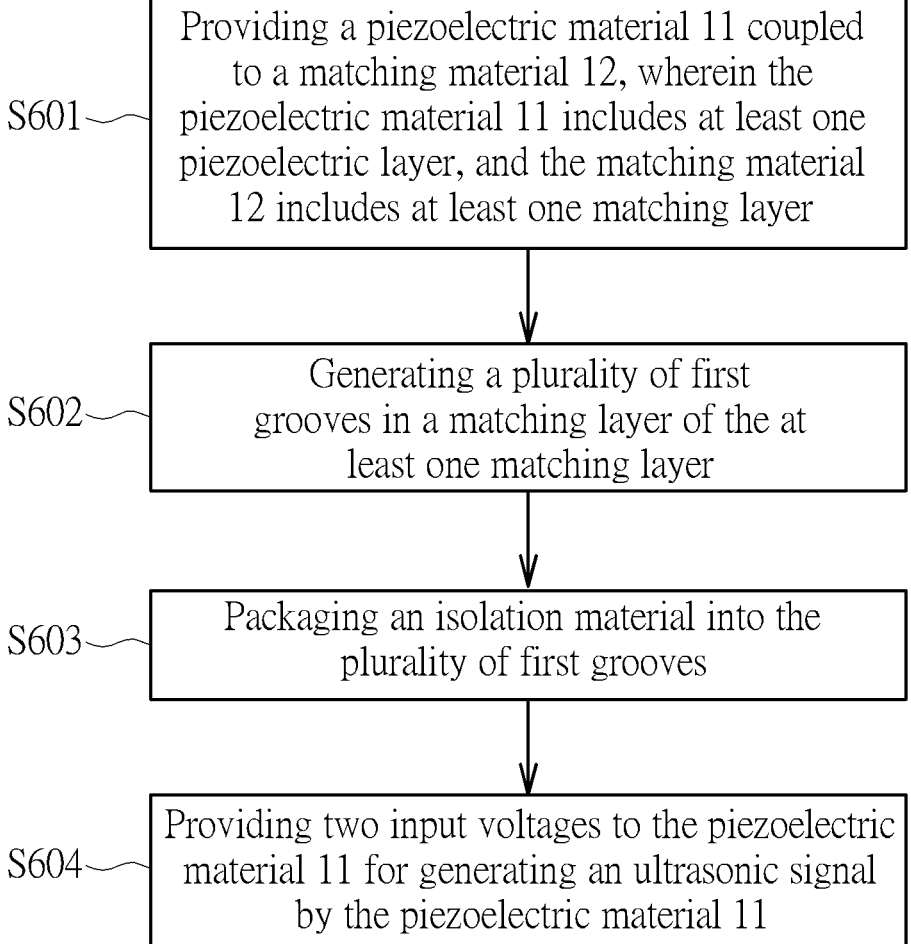

S601 —— Providing a piezoelectric material 11 coupled to a matching material 12, wherein the piezoelectric material 11 includes at least one piezoelectric layer, and the matching material 12 includes at least one matching layer S602 —— Generating a plurality of first grooves in a matching layer of the at least one matching layer S603 —— Packaging an isolation material into the plurality of first grooves S604 —— Providing two input voltages to the piezoelectric material 11 for generating an ultrasonic signal by the piezoelectric material 11

FIG. 6

WAVEFORM IMPROVEMENT METHOD AND ULTRASONIC TRANSDUCER CAPABLE OF OPTIMIZING ACOUSTIC IMPEDANCE

BACKGROUND OF THE INVENTION

1. Field of the Invention

The present invention illustrates a waveform improvement method and an ultrasonic transducer, and more particularly, a waveform improvement method and an ultrasonic transducer capable of optimizing acoustic impedance by using a plurality of grooves.

2. Description of the Prior Art

With the rapid development of medical technology, the ultrasonic detection method becomes a popular and major technology for applying to non-invasive measurements. Generally, the ultrasonic detection method uses an ultrasonic probe for emitting an ultrasonic signal to an object under a skin. Further, the ultrasonic probe can receive a reflected ultrasonic signal for determining a shape and a position of an invisible object under the skin for various medical purposes. A conventional ultrasonic transducer uses a plurality of piezoelectric devices for emitting multiple beams of ultrasonic signals. Each beam of the ultrasonic signal corresponds to a scan line. Further, the ultrasonic transducer can receive the ultrasonic reflection signal corresponding to the scan line for performing an image recognition function and an object detection function. Generally, in the conventional ultrasonic transducers, matching layers are formed by stacking corresponding materials. The acoustic impedance of the matching layer depends on its material properties. However, the acoustic impedance of the conventional ultrasonic transducer is not optimized. The vibration isolation effect of the conventional ultrasonic transducer is not satisfactory. Therefore, the ultrasonic signal may result in a high-energy ring down pulse. Therefore, an ultrasonic waveform generated by the conventional ultrasonic transducer is not optimized, leading to a reduction of ultrasonic image resolution.

SUMMARY OF THE INVENTION

In an embodiment of the present invention, a waveform improvement method is disclosed. The waveform improvement method comprises providing a piezoelectric material coupled to a matching material, wherein the piezoelectric material comprises at least one piezoelectric layer, and the matching material comprises at least one matching layer, generating a plurality of first grooves in a matching layer of the at least one matching layer, packaging an isolation material into the plurality of first grooves, and providing two input voltages to the piezoelectric material for generating an ultrasonic signal by the piezoelectric material. The matching material is configured to match acoustic impedance of the piezoelectric material. The plurality of first grooves in the matching layer are configured to optimize the acoustic impedance and a vibration isolation effect.

In another embodiment of the present invention, an ultrasonic transducer is disclosed. The ultrasonic transducer comprises a housing, a piezoelectric material, a matching material, and two electrically conductive materials. The housing is configured to provide a space. The piezoelectric material is disposed in the space and configured to receive and generate an ultrasonic signal. The matching material is disposed in the space and configured to match acoustic impedance of the piezoelectric material. The two electrically conductive materials are coupled to the piezoelectric material and configured to input/output electronic signals. The piezoelectric material comprises at least one piezoelectric layer. The matching material comprises at least one matching layer. A matching layer of the at least one matching layer has a plurality of first grooves. An isolation material is packaged into the plurality of first grooves. When the two voltages with opposite polarities are respectively inputted to the two electrically conductive materials, the piezoelectric material generates the ultrasonic signal. The plurality of first grooves in the matching layer are configured to optimize the acoustic impedance and a vibration isolation effect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a flow chart of performing a waveform improvement method by the ultrasonic transducer in FIG. 1

DETAILED DESCRIPTION

Figure 1:
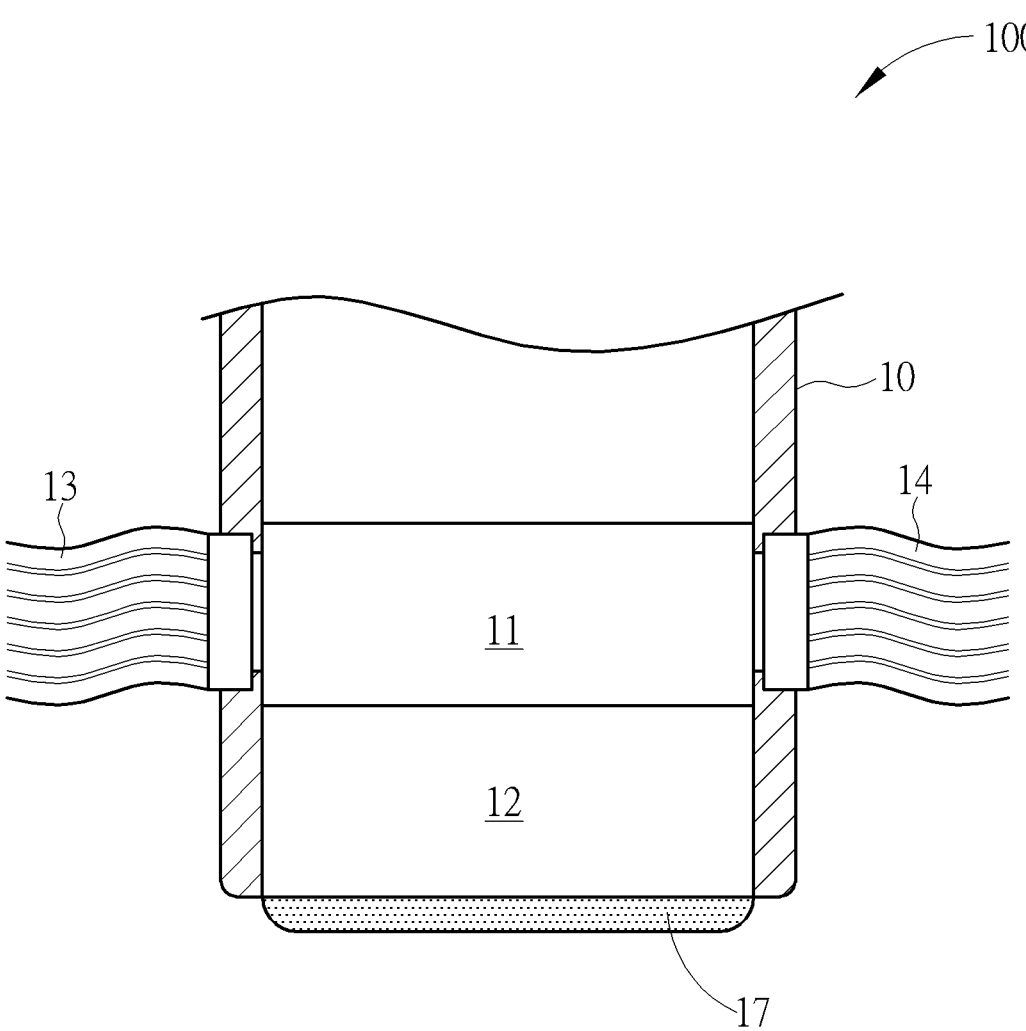
FIG. 1 is a structure of an ultrasonic transducer according to an embodiment of the present invention.

FIG. 1 is a structure of an ultrasonic transducer 100 according to an embodiment of the present invention. The ultrasonic transducer 100 can be a linear transducer, an arc transducer, a circular transducer, a multi-curvature transducer, a spherical transducer, or a non-spherical transducer. The ultrasonic transducer 100 can include a housing 10, a piezoelectric material 11, a matching material 12, a first electrically conductive material 13, and a second electrically conductive material 14. The housing 10 is used for providing a space. The piezoelectric material 11 is disposed in the space for receiving and generating an ultrasonic signal. The piezoelectric material 11 can be a piezoelectric crystal with a ceramic structure. Further, the piezoelectric material 11 has preset acoustic impedance, such as 40M-Rayl (density(g/cm$^3$)*velocity(m/s)).

The matching material 12 is disposed in the space for matching acoustic impedance of the piezoelectric material 11. The first electrically conductive material 13 and a second electrically conductive material 14 are coupled to the piezoelectric material 11 for inputting/outputting electronic signals. Further, the ultrasonic transducer 100 can include a protective material 17 and a lens layer. The protective material 17 can be disposed outside the housing 10. In other words, the housing 10 cannot cover the protective material 17. Any reasonable hardware modification of the ultrasonic transducer 100 falls into the scope of the present invention. In the ultrasonic transducer 100, the piezoelectric material 11 can include at least one piezoelectric layer. The matching material 12 can include at least one matching layer. Further, a matching layer of the at least one matching layer has a plurality of first grooves. An isolation material can be packaged into the plurality of first grooves. The isolation material can be any non-conductive material. For example, any liquid or solid material or air having a vibration isolation effect can be regarded as the isolation material of the present invention. The first electrically conductive material 13 and the second electrically conductive material 14 can be flexible printed circuit (FPC) boards or any conductive device. When the two voltages with opposite polarities are respectively inputted to the first electrically conductive material 13 and the second electrically conductive material 14, the piezoelectric material 11 can generate the ultrasonic signal. In the ultrasonic transducer 100, the piezoelectric material 11 is adjacent to the matching material 12. Further, the plurality of first grooves in the matching layer can be used for optimizing the acoustic impedance and a vibration isolation effect. For example, as previously mentioned, the piezoelectric material 11 has original acoustic impedance equal to 40M rate. The matching material 12 can include a matching layer having 7M rate of acoustic impedance and a matching layer having 2M rate of acoustic impedance. However, after the first grooves are generated on the matching material 12, the acoustic impedance of the piezoelectric material 12 can be matched. For example, the acoustic impedance of the piezoelectric material 11 can be changed from 40M rate to 16M rate. Further, after the first grooves are generated on the matching material 12, harmonic noise generated outside a receiving point of the ultrasonic signal can be isolated by using the first grooves. Therefore, a ring down pulse of the ultrasonic signal in a spectrum domain can be decreased.

Figure 2:
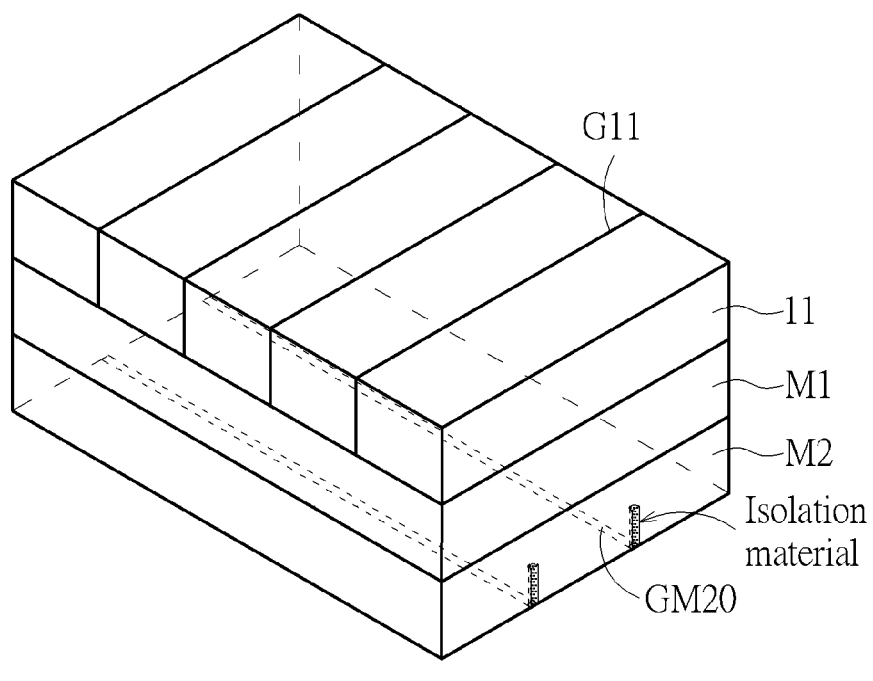
FIG. 2 is a first structure of a piezoelectric material and a matching material of the ultrasonic transducer in FIG. 1.

FIG. 2 is a first structure of the piezoelectric material 11 and the matching material 12 of the ultrasonic transducer 100. As shown in FIG. 2, a plurality of second grooves G11 can be generated on the piezoelectric material 11. The plurality of second grooves G11 in the piezoelectric material 11 can be arranged vertically or horizontally. For example, the second grooves G11 of the piezoelectric material 11 can be arranged vertically for partitioning the piezoelectric material 11 into a plurality of array elements. In FIG. 2, the matching material 12 can include a first matching layer M1 and a second matching layer M2. The first matching layer M1 is disposed between the piezoelectric material 11 and the second matching layer M2. The first matching layer M1 or the second matching layer M2 has the plurality of first grooves. The plurality of first grooves of the first matching layer M1 or the second matching layer M2 correspond to the plurality of second grooves of the piezoelectric material 11. For example, in FIG. 2, the second matching layer M2 has the plurality of first grooves GM20. Further, when the piezoelectric material 11 is partitioned into different array elements according to the second grooves G11 arranged vertically, the first grooves GM20 of the second matching layer M2 can be arranged horizontally. The first grooves GM20 disposed on the second matching layer M2 can be used for improving horizontal vibration isolation of each array element of the piezoelectric material 11. Therefore, the vibration isolation effect of the array elements of the piezoelectric material 11 can be improved. In other words, each array element of the piezoelectric material 11 corresponds to the first grooves GM20 disposed on the second matching layer M2. Further, the number of first grooves GM20 of the matching material 12 can be reasonably modified. Sizes, widths, and depths of the first grooves GM20 of the matching material 12 can also be reasonably modified. Depths of the plurality of first grooves GM20 are smaller than a thickness of the second matching layer M2 or the first matching layer M1. In other words, the first grooves of the matching material 12 cannot physically cut the matching material 12 into at least two separated parts. Further, gaps of the plurality of first grooves GM20 can be identical. The at least one matching layer can a linear matching layer, an arc matching layer, a circular matching layer, a multi-curvature matching layer, a spherical matching layer, or a non-spherical matching layer.

Figure 3:
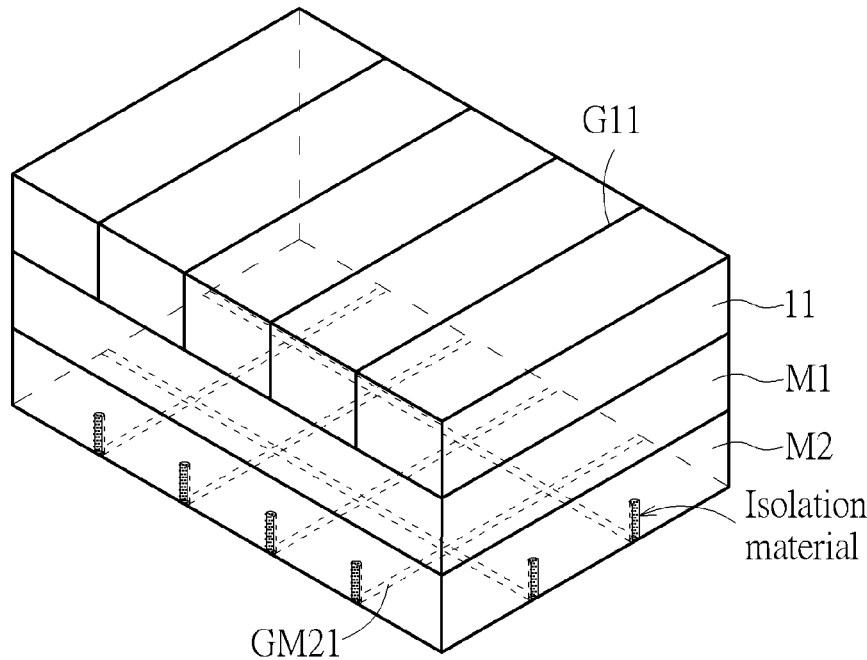
FIG. 3 is a second structure of the piezoelectric material and the matching material of the ultrasonic transducer in FIG. 1.

FIG. 3 is a second structure of the piezoelectric material 11 and the matching material 12 of the ultrasonic transducer 100. As shown in FIG. 3, the plurality of second grooves G11 can be generated on the piezoelectric material 11. The plurality of second grooves G11 in the piezoelectric material 11 can be arranged vertically or horizontally. For example, the second grooves G11 of the piezoelectric material 11 can be arranged vertically for partitioning the piezoelectric material 11 into a plurality of array elements. In FIG. 3, the matching material 12 can include the first matching layer M1 and the second matching layer M2. The first matching layer M1 is disposed between the piezoelectric material 11 and the second matching layer M2. The first matching layer M or the second matching layer M2 has the plurality of first grooves GM21. For example, the first grooves GM21 of the second matching layer M2 can be arranged in a grid pattern. Details of limitations of depths and gaps of the first grooves GM21 are previously illustrated. Thus, they are omitted here. Further, although the second matching layer M2 has the first grooves GM21 arranged in the grid pattern, the ultrasonic transducer 100 is not limited thereto. In other embodiments, the piezoelectric material 11 can include the plurality of second grooves G11. The plurality of second grooves G11 can be aligned to the plurality of first grooves GM21. In other embodiments, only the first matching layer M1 of the ultrasonic transducer 100 has the first groove. Alternatively, both the first matching layer M1 and the second matching layer M2 of the ultrasonic transducer 100 can have the first groove. Details are described later.

Figure 4:
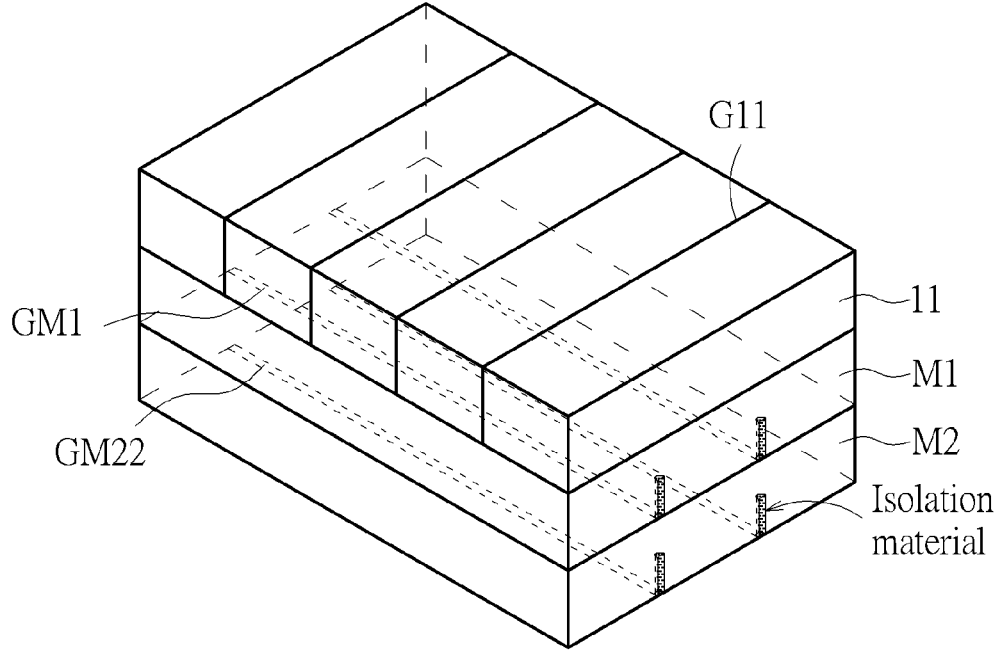
FIG. 4 is a third structure of the piezoelectric material and the matching material of the ultrasonic transducer in FIG. 1.

FIG. 4 is a third structure of the piezoelectric material 11 and the matching material 12 of the ultrasonic transducer 100. As shown in FIG. 4, the plurality of second grooves G11 can be generated on the piezoelectric material 11. The plurality of second grooves G11 in the piezoelectric material 11 can be arranged vertically or horizontally. For example, the second grooves G11 of the piezoelectric material 11 can be arranged vertically for partitioning the piezoelectric material 11 into the plurality of array elements. In FIG. 4, the matching material 12 can include the first matching layer M1 and the second matching layer M2. The first matching layer M1 is disposed between the piezoelectric material 11 and the second matching layer M2. The first matching layer M1 and the second matching layer M2 have the plurality of first grooves. As shown in FIG. 4, the first matching layer M1 has a plurality of first grooves GM1. The second matching layer M2 has a plurality of first grooves GM22. The plurality first grooves GM1 of the first matching layer M1 and the plurality first grooves GM22 of the second matching layer M2 can be arranged vertically or horizontally. Further, the number of first grooves GM1 of the first matching layer M1 and the number of first grooves GM22 of the second matching layer M2 can be reasonably modified. Sizes, widths, and depths of the first grooves GM1 and the first grooves GM22 can also be reasonably modified. Depths of the first grooves GM1 of the first matching layer M1 and the first grooves GM22 of the second matching layer M2 are smaller than a minimum thickness of the first matching layer M1 and the second matching layer M2. In other words, the first grooves GM1 and the first grooves GM22 of the matching material 12 cannot physically cut the matching material 12 into at least two separate parts. In FIG. 4, the second matching layer M2 includes a first surface and a second surface. The first surface is connected to the first matching layer M1. The plurality of first grooves GM1 and the plurality of first grooves GM22 are formed by performing a cutting process along a horizontal direction of the second surface. Particularly, the cutting process can optionally cut the second matching layer M2. When the second matching layer M2 is cut, the cutting process can optionally cut a part of the first matching layer M1 without cutting off the entire first matching layer M1. The first grooves GM1 disposed on the first matching layer M1 and the first grooves GM22 disposed on the second matching layer M2 can be used for improving horizontal vibration isolation of each array element of the piezoelectric material 11. Therefore, the vibration isolation effect of the array elements of the piezoelectric material 11 can be improved. In other words, each array element of the piezoelectric material 11 corresponds to the first grooves GM1 of the first matching layer M1 and the first grooves GM22 of the second matching layer M2.

The ultrasonic transducer 100 can transmit and receive the ultrasonic signal, as illustrated below. As previously mentioned, the piezoelectric material 11 can be the piezoelectric ceramic material. In the ultrasonic transducer 100, after the piezoelectric material 11 receives the ultrasonic signal, the piezoelectric material 11 can be vibrated elastically. Therefore, a plurality of charges with opposite polarities can be generated on two sides of the piezoelectric material 11. The plurality of charges can generate electrical signals through the first electrically conductive material 13 and the second electrically conductive material 14. Then, the electrical signals can be transmitted to an external circuit through the first electrically conductive material 13 and the second electrically conductive material 14. Further, when the two voltages with opposite polarities are inputted to the two sides of the piezoelectric material 11 through the first electrically conductive material 13 and the second electrically conductive material 14, the piezoelectric material 11 can use the matching layer having the plurality of first grooves for performing an acoustic impedance matching process and generating the ultrasonic signal through resonance.

As previously mentioned, the ultrasonic transducer 100 can be the linear transducer, the arc transducer, the circular transducer, the multi-curvature transducer, the spherical transducer, or the non-spherical transducer. In other words, the at least one matching layer of the ultrasonic transducer 100 can be the linear matching layer, the arc matching layer, the circular matching layer, the multi-curvature matching layer, the spherical matching layer, or the non-spherical matching layer. Further, when the piezoelectric material 11 has a single-element array, grooves of the matching material 12 can be arranged in a grid pattern. When the piezoelectric material 11 has a plurality of element arrays, the grooves of the matching material 12 can correspond to regions of the element arrays of the piezoelectric material 11 for improving the vibration isolation effect.

Figure 5:
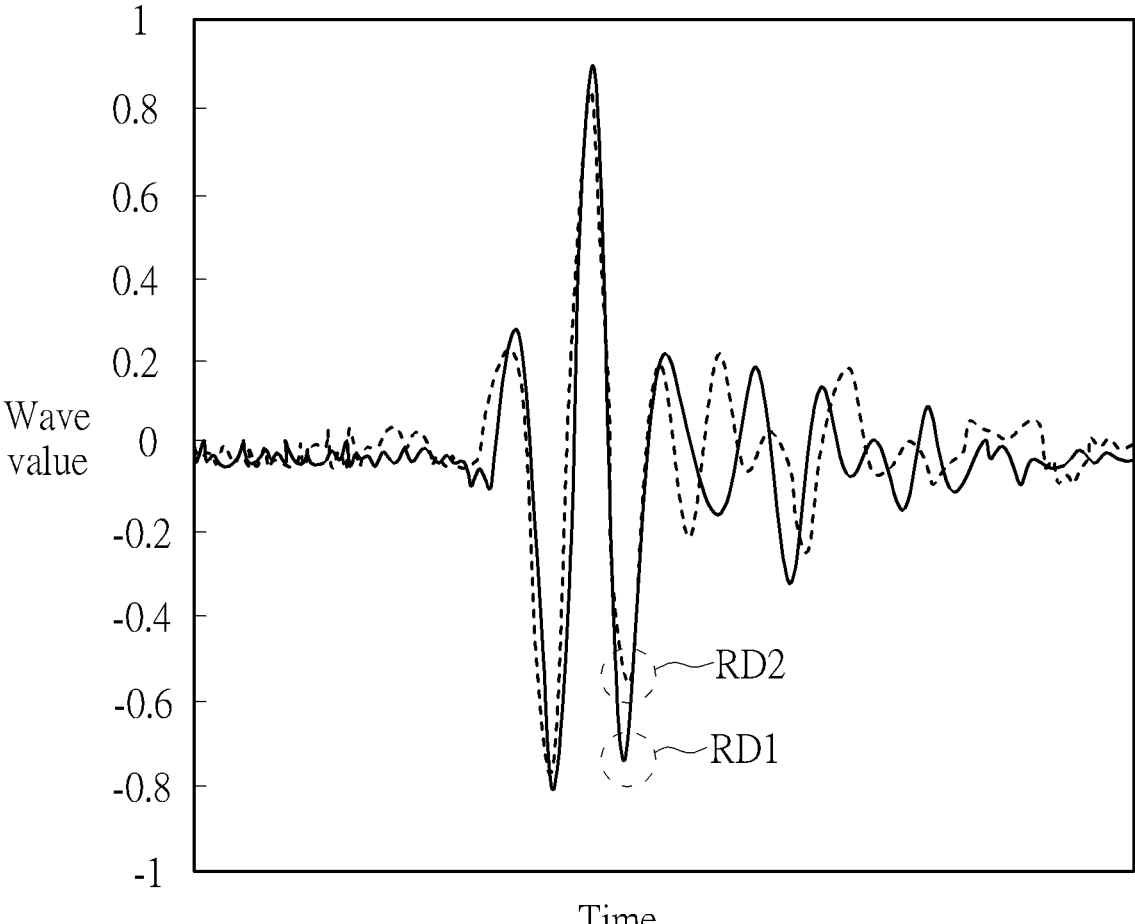
FIG. 5 is an illustration of improving a ring down pulse of an ultrasonic signal in a spectrum domain of the ultrasonic transducer in FIG. 1.

FIG. 5 is an illustration of improving a ring down pulse of an ultrasonic signal in a spectrum domain of the ultrasonic transducer 100. Generally, two or three ring down pulses may be introduced when the ultrasonic transducer 100 generates the ultrasonic signal. Particularly, when amplitudes of the ringing pulses are decreased, a waveform of the ultrasonic signal can be improved. In FIG. 5, a solid line is a pulse echo waveform of an ultrasonic signal generated by a conventional ultrasonic transducer having the matching material 12 without introducing the first grooves. Y-axis is a wave value axis. X-axis is a time axis. RD1 is one of ring down pulses of the conventional ultrasonic transducer. A dotted line is a pulse echo waveform of the ultrasonic signal generated by the ultrasonic transducer 100 having the matching material 12 with first grooves. RD2 is one of ring down pulses of the ultrasonic transducer 100. In FIG. 5, an amplitude of the ring down pulse RD2 is smaller than an amplitude of the ring down pulse RD1. Further, in the ultrasonic signal generated by the ultrasonic transducer 100 having the matching material 12 with first grooves, most of the ringing pulses and harmonic amplitudes are smaller than the ringing pulses and harmonic amplitudes generated by the conventional ultrasonic transducer. In other words, in the ultrasonic transducer 100, after the piezoelectric material uses the matching layer having the plurality of first grooves for performing an acoustic impedance matching process and generating the ultrasonic signal through a resonance method, a ring down pulse of the ultrasonic signal is decreased. Since the waveform of the ultrasonic signal generated by the ultrasonic transducer 100 can be optimized, power of the ultrasonic signal in the spectrum domain can be more concentrated. Therefore, the image resolution of the ultrasonic transducer 100 can be increased.

FIG. 6 is a flow chart of performing a waveform improvement method by the ultrasonic transducer 100. The waveform improvement method includes step S601 to step S604. Any reasonable technology modification falls into the scope of the present invention. Details of step S601 to step S604 are illustrated below.

step S601: providing a piezoelectric material 11 coupled to a matching material 12, wherein the piezoelectric material 11 includes at least one piezoelectric layer, and the matching material 12 includes at least one matching layer;

step S602: generating a plurality of first grooves in a matching layer of the at least one matching layer;

step S603: packaging an isolation material into the plurality of first grooves;

step S604: providing two input voltages to the piezoelectric material 11 for generating an ultrasonic signal by the piezoelectric material 11.

Details of step S601 to step S604 are previously illustrated. Thus, they are omitted here. In the ultrasonic transducer 100, since the plurality of first grooves are introduced to the matching material 12 for optimizing the acoustic impedance, the waveform of the ultrasonic signal generated by the ultrasonic transducer 100 can be improved. Therefore, the image resolution of the ultrasonic transducer 100 can be increased.

To sum up, the present invention discloses a waveform improvement method and an ultrasonic transducer. The ultrasonic transducer includes the piezoelectric material and the matching material. At least one matching layer of the matching material has a plurality of grooves. The plurality of grooves can be used for optimizing acoustic impedance of the piezoelectric material. Further, after the acoustic impedance is optimized, power of the ringing pulses and harmonic amplitudes can be reduced. Therefore, the image resolution of the ultrasonic transducer can be increased.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A waveform improvement method comprising:

providing a piezoelectric material coupled to a matching material, wherein the piezoelectric material comprises at least one piezoelectric layer, and the matching material comprises at least one matching layer;

generating a plurality of first grooves in a matching layer of the at least one matching layer;

packaging an isolation material into the plurality of first grooves; and providing two input voltages to the piezoelectric material for generating an ultrasonic signal by the piezoelectric material;

wherein the matching material is configured to match acoustic impedance of the piezoelectric material, and the plurality of first grooves in the matching layer are configured to optimize the acoustic impedance and a vibration isolation effect; and wherein depths of the plurality of first grooves are smaller than a thickness of the matching layer; wherein the at least one matching layer comprises a first matching layer and a second matching layer, the first matching layer is disposed between the at least one piezoelectric layer and the second matching layer, the second matching layer has the plurality of first grooves, and generating the plurality of first grooves comprises performing a cutting process along a direction perpendicular to a surface of the second matching layer such that the cutting process optionally cuts a part of the first matching layer without cutting off the entire first matching layer.

2. The method of claim 1, further comprising:

generating a plurality of second grooves in the at least one piezoelectric layer;

wherein the plurality of second grooves in the at least one piezoelectric layer are arranged vertically or horizontally.

3. The method of claim 2, wherein the plurality of first grooves of the second matching layer correspond to the plurality of second grooves of the at least one piezoelectric layer.

4. The method of claim 2, wherein the first matching layer and the second matching layer have the plurality of first grooves, and the plurality of first grooves of the first matching layer and the second matching layer correspond to the plurality of second grooves of the at least one piezoelectric layer.

5. The method of claim 1, wherein the piezoelectric material is a piezoelectric ceramic material, when the piezoelectric material receives an ultrasonic signal, a plurality of charges with opposite polarities are generated on two sides of the piezoelectric ceramic material, and the plurality of charges generate electrical signals through two electrically conductive materials.

6. The method of claim 5, wherein when two voltages with opposite polarities are inputted to the two sides of the piezoelectric ceramic material, the piezoelectric ceramic material uses the matching layer having the plurality of first grooves for performing an acoustic impedance matching process and generating the ultrasonic signal through resonance.

7. The method of claim 6, wherein after the piezoelectric material uses the matching layer having the plurality of first grooves for performing an acoustic impedance matching process and generating the ultrasonic signal through a resonance method, a ring down pulse of the ultrasonic signal is decreased.

8. The method of claim 1, wherein the at least one matching layer is a linear matching layer, an arc matching layer, a circular matching layer, a multi-curvature matching layer, a spherical matching layer, or a non-spherical matching layer.

9. The method of claim 1, wherein gaps of the plurality of first grooves in the matching layer are identical.

10. An ultrasonic transducer comprising:

a housing configured to provide a space;

a piezoelectric material disposed in the space and configured to receive and generate an ultrasonic signal;

a matching material disposed in the space and configured to match acoustic impedance of the piezoelectric material; and two electrically conductive materials coupled to the piezoelectric material and configured to input/output electronic signals;

wherein the piezoelectric material comprises at least one piezoelectric layer, the matching material comprises at least one matching layer, a matching layer of the at least one matching layer has a plurality of first grooves, an isolation material is packaged into the plurality of first grooves, when the two voltages with opposite polarities are respectively inputted to the two electrically conductive materials, the piezoelectric material generates the ultrasonic signal, and the plurality of first grooves in the matching layer are configured to optimize the acoustic impedance and a vibration isolation effect; and wherein the at least one matching layer comprises a first matching layer and a second matching layer, the first matching layer is disposed between the at least one piezoelectric layer and the second matching layer, the second matching layer comprises a first surface and a second surface, the first surface is connected to the first matching layer, and the plurality of first grooves are formed by performing a cutting process along a direction perpendicular to the second surface; wherein the cutting process optionally cuts the second matching layer, when the second matching layer is cut, the cutting process optionally cuts a part of the first matching layer without cutting off the entire first matching layer.

11. The ultrasonic transducer of claim 10, wherein the piezoelectric material comprises a plurality of second grooves, the plurality of second grooves are perpendicular to the plurality of first grooves.

12. The ultrasonic transducer of claim 10, wherein the piezoelectric material comprises a plurality of second grooves, the plurality of second grooves are aligned to the plurality of first grooves.

13. The ultrasonic transducer of claim 10, wherein the piezoelectric material is a piezoelectric ceramic material, when the piezoelectric material receives an ultrasonic signal, a plurality of charges with opposite polarities are generated on two sides of the piezoelectric ceramic material, and the plurality of charges generate electrical signals through the two electrically conductive materials.

14. The ultrasonic transducer of claim 10, wherein after the piezoelectric material uses the matching layer having the plurality of first grooves for performing an acoustic impedance matching process and generating the ultrasonic signal through resonance, a ring down pulse of the ultrasonic signal is decreased.

15. The ultrasonic transducer of claim 10, wherein the at least one matching layer is a linear matching layer, an arc matching layer, a circular matching layer, a multi-curvature matching layer, a spherical matching layer, or a non-spherical matching layer.

16. The ultrasonic transducer of claim 10, wherein gaps of the plurality of first grooves in the matching layer are identical.

\* \* \* \* \*